US008728831B2

(12) United States Patent
Gan et al.

(10) Patent No.: US 8,728,831 B2
(45) Date of Patent: May 20, 2014

(54) RECONSTITUTED WAFER WARPAGE ADJUSTMENT

(75) Inventors: Kah Wee Gan, Maur (MY); Yonggang Jin, Singapore (SG)

(73) Assignee: STMicroelectronics Pte. Ltd., Singapore (SG)

( * ) Notice: Subject to any disclaimer, the term of this patent is extended or adjusted under 35 U.S.C. 154(b) by 307 days.

(21) Appl. No.: 12/982,707

(22) Filed: Dec. 30, 2010

(65) Prior Publication Data

US 2012/0171875 A1    Jul. 5, 2012

(51) Int. Cl.
*H01L 21/00* (2006.01)

(52) U.S. Cl.
USPC .............................. 438/4; 438/799; 438/800

(58) Field of Classification Search
USPC ................. 438/540, 550, 795, 799, 800, 909, 438/FOR. 298, FOR. 303, FOR. 408, 4, 907; 257/E21.077, E21.084, E21.333, 257/E33.075; 29/743, 744; 118/724, 725, 118/641, 58, 101
See application file for complete search history.

(56) References Cited

U.S. PATENT DOCUMENTS

| 3,889,801 | A | * | 6/1975 | Boyer ........................ 198/689.1 |
| 4,498,833 | A | * | 2/1985 | Hertel ........................... 414/217 |
| 4,624,862 | A | * | 11/1986 | Yang et al. ....................... 427/74 |
| 4,915,624 | A | * | 4/1990 | Mittelstadt ...................... 432/59 |
| 5,474,612 | A | * | 12/1995 | Sato et al. ...................... 118/725 |
| 5,815,396 | A | * | 9/1998 | Shimamura et al. .......... 700/123 |
| 5,894,984 | A | * | 4/1999 | Sakai et al. .............. 228/180.22 |
| 6,073,501 | A | * | 6/2000 | Rohner ......................... 73/865.8 |
| 6,120,607 | A | * | 9/2000 | Taravade ....................... 118/720 |
| 6,171,641 | B1 | * | 1/2001 | Okamoto et al. ................. 427/8 |
| 8,247,741 | B2 | * | 8/2012 | Pepler et al. ................... 219/388 |
| 2002/0003216 | A1 | * | 1/2002 | Kida et al. ..................... 250/548 |
| 2002/0158324 | A1 | * | 10/2002 | Hamaguchi et al. .......... 257/686 |
| 2004/0069234 | A1 | * | 4/2004 | Kasai et al. ................... 118/725 |
| 2005/0095752 | A1 | * | 5/2005 | Liu ............................... 438/127 |
| 2005/0286030 | A1 | * | 12/2005 | Shih et al. ....................... 355/30 |
| 2006/0134919 | A1 | * | 6/2006 | Hamelin et al. .............. 438/706 |

FOREIGN PATENT DOCUMENTS

JP            06-039709       *  2/1994

* cited by examiner

*Primary Examiner* — Colleen Matthews
*Assistant Examiner* — Quovaunda V Jefferson
(74) *Attorney, Agent, or Firm* — Seed IP Law Group PLLC

(57) ABSTRACT

A system and method for reducing warpage of a semiconductor wafer. The system includes a device for securing the semiconductor wafer in a heating area. The device includes a holding mechanism for securing an edge of the semiconductor wafer. The device further includes a pressure reducing device that reduces the pressure underneath the semiconductor device, which further secures the semiconductor device in the heating area. The heating area includes a plurality of heating and cooling zones in which the semiconductor wafer is subjected to various temperatures.

15 Claims, 6 Drawing Sheets

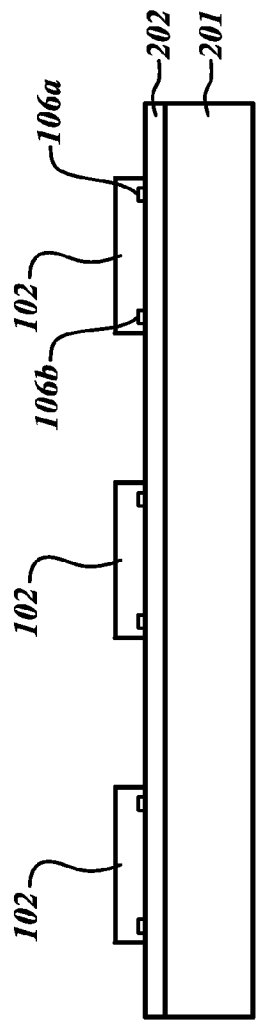
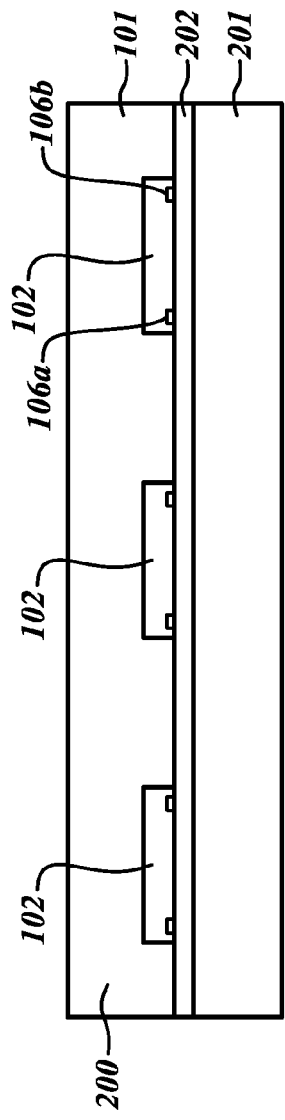

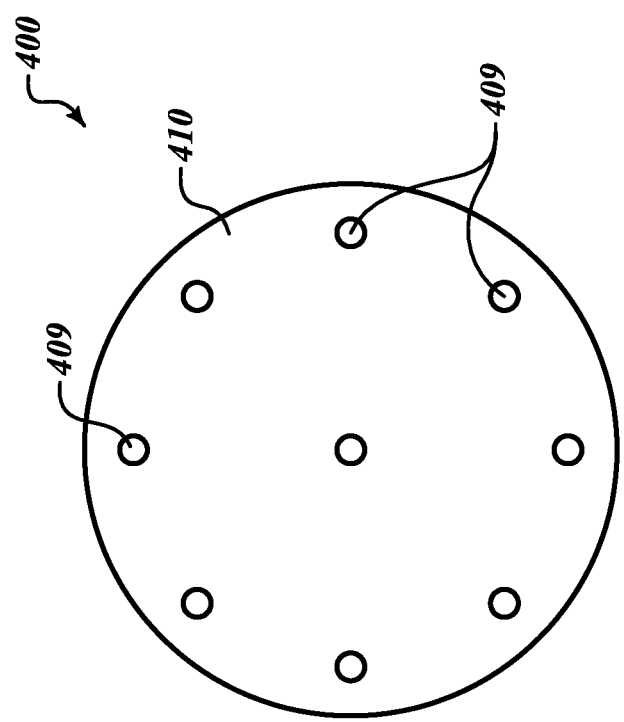

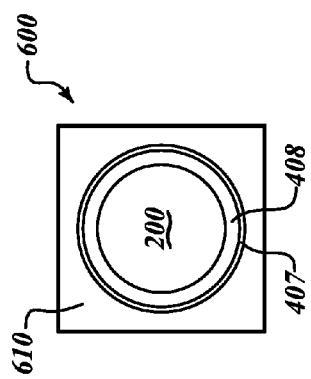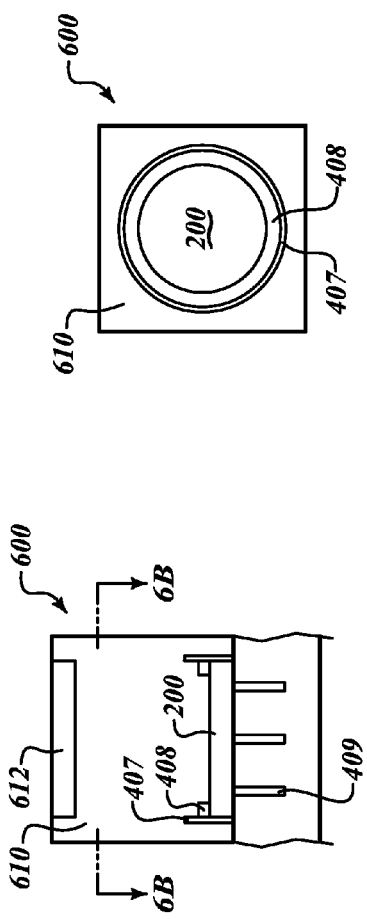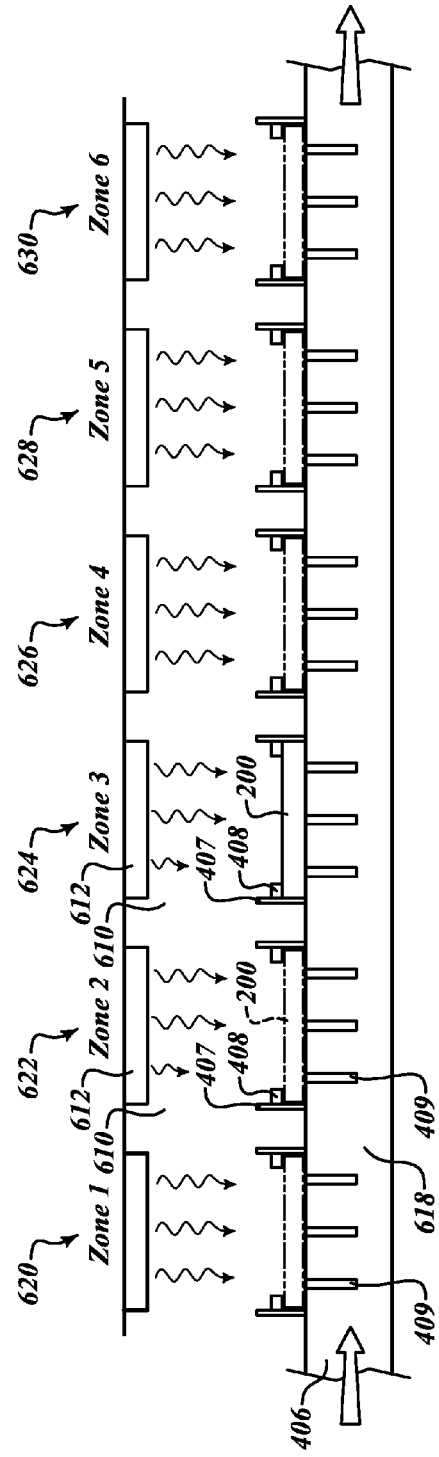

RECONSTITUTED WAFER WARPAGE ADJUSTMENT

BACKGROUND

1. Technical Field

The present application relates to a system and method for adjusting warpage of a wafer through gradual heating and cooling.

2. Description of the Related Art

Currently hundreds of copies of the same semiconductor die are formed on a large silicon wafer and then cut apart as individual for use in electronic devices.

Once the chips are cut from the silicon wafer, they are not yet ready for use. The chips must be packaged in a way that not only provides physical protection from external environmental factors, but also to couple the chips to electrical connections used to connect to other electronic devices. Due to the very small size of the chip's components and electrical connections, it is preferable to develop methods of creating the chip packages that keep efficiency of production up and cost down.

One technique in use today is to place the individual die on a new substrate spaced some distance apart from each other. This new substrate may be round, square or any desired shape and made form any desired material that will support individual die. The new substrate having a large number of die placed thereon spaced apart from each other is called a reconstituted wafer, also referred to as an EWLB wafer in the industry. After the die are placed on the new substrate to form the reconstituted wafer, further processing takes place to electrically connect the die to terminals, solder balls or other electrical connections.

As part of forming the reconstitution wafer, a molding compound is flowed over and around the die to enclose them and the electrical lead. Due to the molding layer and the die being of very different materials, however, undesirable stresses may occur near where the molding layer and the die make contact. In some instances, the EWLB wafer may crack, the molding layer or the die may fracture, or other breaks may occur which would result in a semiconductor chip that does not work. Another effect due to the difference in materials between the molding layer and the chip is that the molding layer may cause the reconstituted wafer to become warped or deformed. While there may be no fractures in the chips or molding layer, a warped or deformed reconstituted wafer may also be undesirable and lead to degraded performance of the embedded chips.

BRIEF SUMMARY

In the present disclosure there is described a reconstituted wafer that is positioned in a device to secure it in place. In one aspect, the reconstituted wafer is secured by reducing the air pressure underneath the reconstituted wafer. The reconstituted wafer may also be heated and cooled. According to one aspect of the present disclosure, the air pressure may be reduced by a vacuum portion underneath the reconstituted wafer. Further, in one aspect, the heating and cooling of the reconstituted wafer may occur in two or more heating zones.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

FIGS. 2A and 2B show two steps in formation of a reconstituted wafer that includes individual semiconductor dies.

FIG. 5 shows a top view of a vacuum line surface associated with the wafer clamping device.

FIG. 6A shows a side view of a wafer warpage reducing system that incorporates the wafer clamping device.

FIG. 6B shows a top view of the wafer warpage reducing system of FIG. 6A taken along the line 6B-6B.

FIG. 6C is a side view of wafer warpage reducing systems in another embodiment.

DETAILED DESCRIPTION

Figure 1:
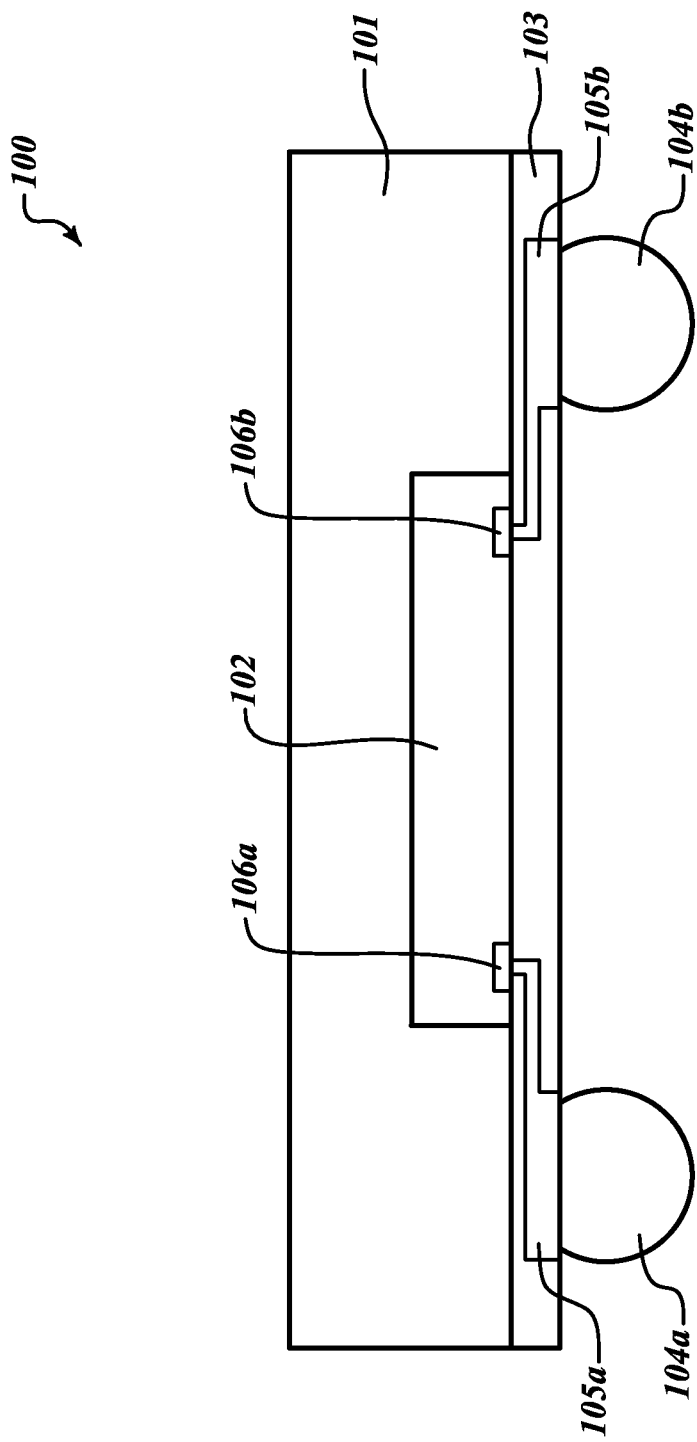
FIG. 1 shows a side view of a semiconductor package that has been made from a reconstituted wafer.

In the following description, certain specific details are set forth in order to provide a thorough understanding of various aspects of the invention. However, the invention may be practiced without these specific details. In some instances, well-known structures and methods of forming the structures associated with the semiconductor package have not been described in detail to avoid obscuring the descriptions of the aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one aspect" or "an aspect" means that a particular feature, structure, or characteristic described in connection with the aspect is included in at least one aspect. Thus, the appearances of the phrases "in one aspect" or "in an aspect" in various places throughout this specification are not necessarily all referring to the same aspect. Furthermore, the particular features, structures, or characteristics may be combined in any suitable manner in one or more aspects of the present disclosure.

In the drawings, identical reference numbers identify similar features or elements. The size and relative positions of features in the drawings are not necessarily drawn to scale.

FIG. 1 shows a side view of an interior section of a semiconductor package 100 that has been formed according the present disclosure. According to one aspect of the present disclosure, the semiconductor package 100 has an encapsulation layer 101 covering a semiconductor die 102 and a substrate 103. The encapsulation layer 101 may be formed of a semiconductor molding material. Materials used for encapsulating semiconductor devices may include plastic molding compounds that are generally composite materials. Examples of molding compounds include, epoxy resins, phenolic hardeners, silicas, catalysts, pigments, mold release agents, and the like. In one aspect of the present disclosure, the encapsulation layer 101 acts as an electrical insulating and protective layer for the semiconductor die 102 and the substrate 103.

The semiconductor die 102 is formed according to well known semiconductor processing techniques, such as forming various layers of conducting, insulating, and semi-conducting materials. The semiconductor die 102 may be designed to carry out various functions, including data processing, control of other electronic devices, etc. Additionally, according to one aspect of the present disclosure, the substrate 103 may be used as an electrical insulating and protective layer and include electrical traces 105a and 105b used for coupling the semiconductor die 102 to external electrical devices. The substrate 103 may be formed of an insulating material, such as silicon or the like.

As further seen in FIG. 1, there are solder balls 104a and 104b placed to establish electrical connections from the external environment of the semiconductor package 100 to the semiconductor die 102 inside the semiconductor package 100. The solder balls 104a and 104b may be attached to the substrate 103 using an electrical connection material, such as solder reflow paste, or the like. The solder balls 104a and 104b are electrically connected to the semiconductor die 102 via the electrical traces 105a and 105b, respectively. The electrical traces 105a and 105b are electrically connected with the semiconductor die 102 via semiconductor die contact pads 106a and 106b, respectively.

In one aspect of the present disclosure, FIGS. 2A and 2B show a process for forming a reconstituted wafer 200. In FIGS. 2A and 2B, a support carrier 201 is formed with an adhesive layer 202 formed or placed on a top surface of the support carrier 201. Individually cut semiconductor dies, such as semiconductor dies 102, are placed on the adhesive layer 202 after they are cut from the larger semiconductor die wafer. Each of the semiconductor dies 102 include semiconductor die contact pads 106a and 106b. In one embodiment, the semiconductor dies 102 are placed with the semiconductor die contact pads facing the adhesive layer 202. In other embodiments, the back side of wafers are coupled to the support carrier 201 via the adhesive layer 202.

In one aspect of the present disclosure, the support carrier 201 is a rigid structure such as a metal plate, ceramic plate, or the like. In other embodiments, the support carrier 201 is a temporary material and is removed after forming the encapsulation layer 101. The support carrier 201 may also be reusable after the reconstituted wafer 200 is formed. The adhesive layer 202 may be formed of an adhesive tape capable of temporarily securing in place the semiconductor dies 102. According to one aspect of the present disclosure, the adhesive layer 202 may be a double-sided adhesive tape or the like capable of securing in place the semiconductor dies 102.

After the semiconductor dies 102 have been placed on the adhesive layer 202, the encapsulation layer 101 is formed over the adhesive layer 202 and the semiconductor dies 102 as seen in FIG. 2B. After the encapsulation layer 101 is formed as shown in FIG. 2B, the support carrier 201 and the adhesive layer 202 are removed, exposing an active surface of the semiconductor dies, such as the surface exposing the semiconductor die contact pads 106a and 106b. Any acceptable technique of many that are well known may be used for removing the support carrier 201 and the adhesive layer 202 which leaves semiconductor dies 102 and the encapsulation layer 101 substantially in place.

The die 102 can be positioned at a top surface of the encapsulation layer 101, at a bottom surface of the encapsulation layer 101 or on both sides of the encapsulation layer 101. Accordingly, the reconstituted wafer 200 as shown in FIGS. 3A and 3B may, instead of having the die only at the top surface, may have them adjacent the bottom surface or adjacent both the bottom and top surfaces.

Figure 3A:
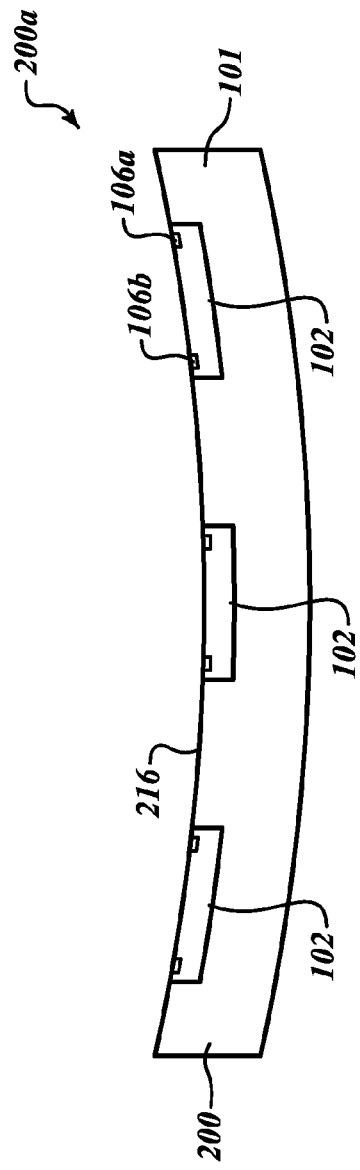
FIGS. 3A and 3B show side views of warped reconstituted wafers in concave and convex shapes.
Figure 3B:
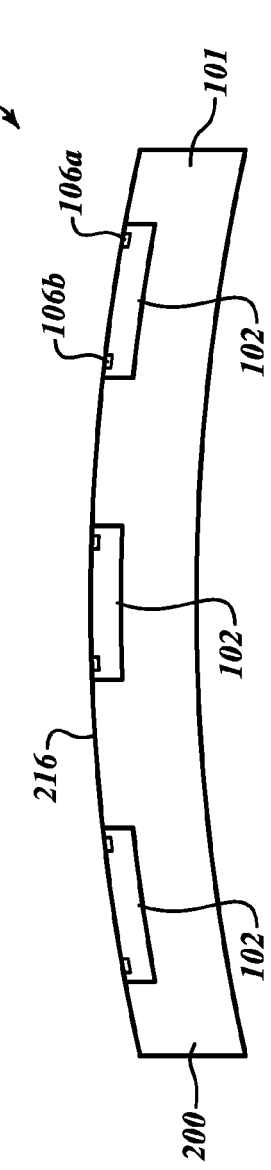

After the support carrier 201 and the adhesive layer 202 are removed, the reconstituted wafer 200 has a top surface 216 that may become deformed or warped as shown in the concave reconstituted wafer 200a of FIG. 3A and the convex reconstituted wafer 200b of FIG. 3B. The concave reconstituted wafer 200a and the convex reconstituted wafer 200b each have the encapsulation layer 101 in which the semiconductor dies 102 are embedded.

The concave reconstituted wafer 200a and the convex reconstituted wafer 200b may be warped or deformed due to differences in the material properties of the encapsulation layer 101 and the semiconductor dies 102. For example, when the materials in the reconstituted wafers 200a or 200b are formed, the physical properties of the encapsulation layer 101 and the semiconductor dies 102 may change, causing stresses in opposing directions. As a result, a concave, convex, or other deformed reconstituted wafer 200 may form. A concave or convex reconstituted wafer 200 is undesirable because portions of the reconstituted wafer may be unusable or prone to failure. The wafer 200 may also become warped by other mechanisms such as uneven drying over time, vapor escape from one surface at a different rate than the other surfaces or many other factors.

One of the root causes of the warpage in the wafer is the difference in coefficient of thermal expansion between the silicon of the dies and the molding compound that encloses them. This difference introduces stress and warpage into the reconstituted wafers 200. When the reconstituted wafers 200 are slightly warped, a robot arm is unable to pick up the wafers. In some instances, the robot arm may pick up the wafers initially then after beginning to transport them the hold is lost and the wafers are dropped causing damage to the semiconductor die and wafer.

Figure 4A:
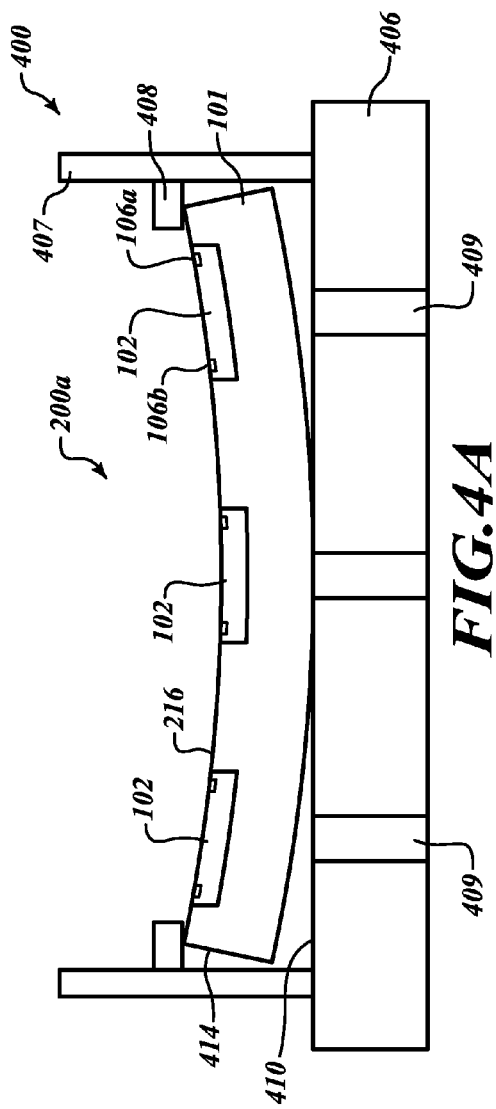
FIGS. 4A and 4B show side views of a wafer clamping device for adjusting warpage of a wafer, including concave and convex wafers.
Figure 4B:
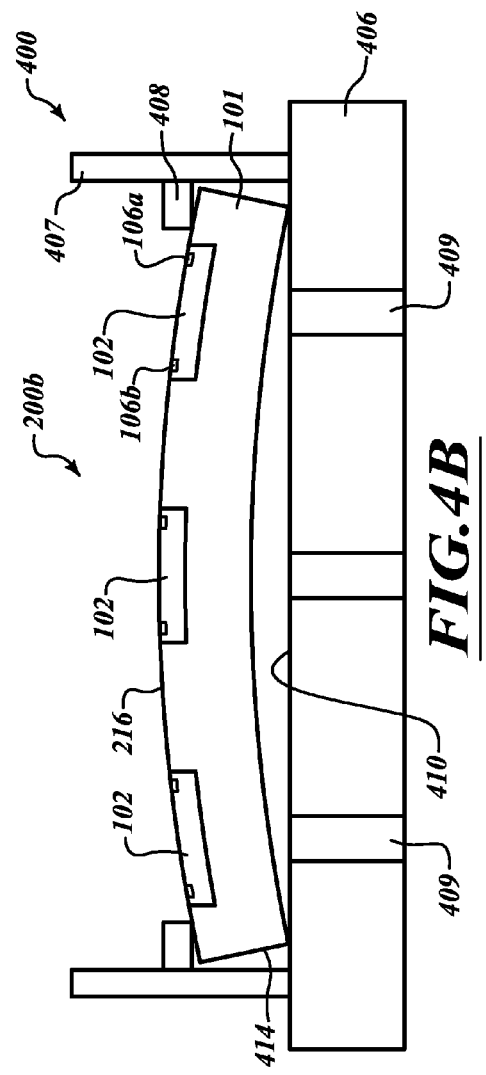

To minimize the effects of a warped or deformed wafer, a wafer clamping device 400 is used as shown in FIGS. 4A and 4B. In FIG. 4A, the wafer clamping device 400 is shown holding a concave reconstituted wafer 200a. Similarly, in FIG. 4B, the wafer clamping device 400 is shown holding a convex reconstituted wafer 200b. Both the concave reconstituted wafer 200a and the convex reconstituted wafer 200b have the encapsulation layer 101 and the semiconductor dies 102.

As further seen in FIGS. 4A and 4B, the wafer clamping device 400 has a vacuum chuck 406 with a clamp support 407. In one aspect of the present disclosure, the clamp support 407 has a clamp bar 408. The vacuum chuck 406 may have a number of independent vacuum channels 409. According to one aspect of the present disclosure, the clamp bar 408 is cylindrical and contacts the top surface 216 of the outer edge of the reconstituted wafer along the entire periphery. Alternatively, in place of the clamp support 407 and clamp bar 408, a recess is present in the vacuum chuck 406 that fits the reconstituted wafer at the edges and prevents the reconstituted wafer from moving laterally.

When the reconstituted wafer 200 is securely fitted and clamped into the wafer clamping device 400, or alternatively is resting in a recessed portion that includes the vacuum lines 409, one or more of the vacuum lines 409 are activated. The activated vacuum lines 409 will cause an area underneath the reconstituted wafers to reduce in pressure. As a result of the reduced pressure underneath the reconstituted wafers, a force is exerted on the opposite side of the reconstituted wafer due to a pressure difference between a top side of the reconstituted wafer and underneath the reconstituted wafer. As a result of the force on the reconstituted wafer, the shape of the reconstituted wafer is urged toward becoming substantially flat with the surface of the vacuum chuck 406.

According to one aspect of the present disclosure, each of vacuum lines 409 are circular and a plurality are positioned at a peripheral edge and in a central region as shown in FIG. 5 where the vacuum chuck 406 has a top surface 410. In an alternative aspect of the present disclosure, the vacuum chuck 406 may have fewer, yet larger openings to the various vacuum lines 409 underneath. The vacuum lines 409 are individual vacuum lines that are independently controllable by the amount of force exerted. Some or all of the vacuum line openings 409 may be segments of a larger vacuum line 409. Although the top surface 410 is in a circular shape, other shapes are also within the scope of the present disclosure.

Preferably, each vacuum line 409 is individually and independently controllable. For a concave wafer 200a, a stronger vacuum will be placed on the lines at the peripheral surface to draw the edges down and hold them flat. On a convex wafer 200b, a stronger vacuum may be placed on one or more central lines 409 at the central region to exert a stronger force to pull the wafer flat. Of course, in some embodiments dozens of vacuum lines 409 are present, for example, in the form of concentric rings of slightly different diameters between the periphery vacuum lines and the center vacuum lines. Depending on the warped shape of the wafer 200, some of the vacuum lines 409 may exert strong pressure, while others of them are somewhat weaker. In most uses, the vacuum lines 409 at the periphery exert the stronger force.

The clamping bar 208 at the wafer has as one primary function to prevent vacuum leakage at the edge of the wafer and to ensure that a force is supplied on the outermost circumferential edge of the wafer. In particular, as shown in FIGS. 4A and 4B the concave wafer 200a and the convex wafer 200b have a circumferential edge 414. When the warped wafer is properly in the vacuum chuck 406, the circumferential edge 414 is closely adjacent the clamp support 407. In some cases, it may slightly contact the clamp support 407 in some locations while being slightly spaced therefrom in other locations. As the vacuum is created through vacuum lines 409, air flows around the circumferential edge 414 of the reconstituted wafer 200. A vacuum force is therefore applied toward the side edges to pull the edge 414 toward the clamp support 407. The clamp bar 408 is in physical contact with the upper top surface 216 of the reconstituted wafer 200. This provides a seal at the top surface to hold the vacuum force along the entire edge.

As shown in FIG. 4A, with the concave reconstituted wafer 200a the seal is created at the outermost edge of the top 216 which assists to provide a vacuum along the wafer edge to prevent vacuum leakout and apply force on the wafer for warpage adjustment. In the convex reconstituted wafer 200b as shown in FIG. 4B, the clamp bar 408 contacts the upper surface 216 of the wafer 200b at a distance spaced slightly from the edge creating a small pocket in which a vacuum is held. This also assists to prevent vacuum leak from the sides of the wafer and assists to spread the wafer edges outward to create a vacuum force both in the downward direction and in the outward direction near the peripheral edge to pull the wafer into a uniformly flat configuration.

In a preferred embodiment, the clamp bar 408 is approximately 2 mm in width and thus extends approximately 2 mm away from the clamp bar 408 to rest on the wafer top surface 216. The clamp bar 408 is a circular metal strip that rides on the clamp supports 407 and is held in place by gravity. As the vacuum is applied, some vacuum force will act to pull the clamp bar 408 down into a sealing relationship with the top surface 216 of the reconstituted wafers 200a, 200b. As the wafer slowly spreads out and becomes more flat, the clamp bar 408 will also be drawn downward and rest on top of the top surface 216 of the wafer, continuing to provide a vacuum seal whenever a vacuum is applied. Accordingly, in the event the wafer is warped such that each edge is spaced approximately 2 mm away from the clamp support 407, the clamp bar 408 will be resting lightly on the peripheral edges and will assist to provide the seal at the edge of the wafer to hold the vacuum as air flows around the circumferential edge 414. Thus, the reconstituted wafers 200a, 200b when first placed in the vacuum chuck 406 as shown in FIGS. 4A and 4B will generally not be in physical contact with the clamp support 407, but will be spaced some distance therefrom, generally 1-2 mm from all sides. As the vacuum is applied, the vacuum is applied from the bottom and air flows around the circumferential edges 414, the cylindrical clamp bar 408, resting lightly on the top surface 216 of the peripheral edges will create a seal for the vacuum so that the air flow does not completely leave and force is created to both draw the wafer downward and also draw it outward toward the clamp supports 407. As the wafer is slowly drawn outward and, as repeated heating cycles occur, as explained in FIGS. 6A-6C, the wafer will begin to touch one or more places at the edges of the clamp support 407 and the clamp bar 408 will descend slightly as the wafer begins to flatten.

Once the reconstituted wafers 200a, 200b are placed in the wafer clamping device 400 and the vacuum lines 409 are activated, the reconstituted wafers are heated and then slowly cooled to cause the reconstituted wafers 200a, 200b to set in a substantially flat configuration. As seen in FIGS. 6A and 6B, a wafer heating assembly 600 has a wafer heating station 610, with a heating element 612. FIG. 6A shows a side view of the wafer heating assembly 600 and FIG. 6B shows a top plan view of the wafer heating assembly 600 taken along the line 6B-6B from FIG. 6A. According to an aspect of the present disclosure, the wafer heating line 600 has a vacuum chuck 406 on which clamped reconstituted wafers 200a, 200b are placed. In one aspect of the present disclosure, the heating elements force heat into the respective heating zone so as to maintain the temperature within a selected range in each respective heating zone.

FIGS. 6A and 6B further show a wafer 200 that is clamped using clamp supports 407 and clamp bars 408 while being heated and cooled. According to one aspect of the present disclosure, a wafer is first held in place through reducing the pressure underneath each wafer 200 via vacuum lines 409. The reduced pressure underneath each wafer causes a pressure difference between the air in the respective heating zone and the air underneath each wafer. As a result, the pressure of the air in the respective heating zone is greater than the air pressure underneath the wafer and forces the wafer to lay substantially flat against the top surface 410 of the vacuum chuck 406 by the time the process is completed.

In some cases, the vacuum pressure is low so the wafers 200 are not forced flat immediately. Rather, over time the wafers will gradually become more flat. After a period of treatment, which may be several hours, the wafers will become substantially flat. In one embodiment, the wafer may move slightly within the boundaries of the clamp supports and clamps, but should not be rigidly held tightly against the chuck 406 and thus will not block the vacuum lines 409. In this way, the clamp supports and clamps may accommodate wafers of varying sizes and air can evenly flow across the bottom of the wafer 200 as it is heated and cooled in heating station 610.

As shown in FIG. 6B, the clamp bars 408 extend entirely around the periphery of the wafer 200 in one embodiment. In an alternative aspect, the clamps may not need to completely seal off the air underneath the wafers from the air inside the heating zones. Instead, the clamps and clamp supports may act as boundaries that keep the wafers relatively in place. When the vacuum lines are activated, the air underneath the wafer will still reduce in pressure as compared to the air inside the heating zone, and the wafer will be urged toward a substantially flat configuration.

According to another aspect of the present disclosure, each heating station 610 may not have the clamp supports 407 and clamp bars 408 to hold the wafers in place. Instead, a top surface of each vacuum chuck 406 may have a recessed portion region the size of the wafer 200 that holds a wafer as previously explained. For example, the top surface of each vacuum line 409 may be lower than the top surface 410 of the vacuum chuck 406. As a result, at least a portion of the side of the wafer may fit in the recessed top surface of each vacuum line 409 thus preventing lateral movement of the wafer while avoiding physical pressure applied to the top surface of the wafer as would happen with the clamp bars 408.

As shown in FIGS. 6A and 6B, each heat station 610 may hold one clamped wafer 200. The warped wafer 200 is placed in the vacuum chuck 406 as illustrated in FIGS. 4A and 4B. The clamp at the wafer prevents the vacuum leak out and also applies a force on the wafer for warp adjustment. The vacuum at the edges is usually applied with greater strength than the vacuum in the central regions. By applying a stronger vacuum at the edge regions around the periphery the wafer is more securely held in position as the curvature causing the warp is removed.

A wafer 200 is placed in the heating station 610 and is gradually heated to a desired temperature. After reaching the desired temperature or after being in the heating station 610 for a period of time, the wafer may be cooled in the same station 610. While the wafer 200 sits at one station 610, the heating element 612 cycles the temperature from hot to cool. This can happen one time or be repeated for a plurality of cycles. According to this embodiment, each station 610 provides precise control for heating and cooling of the reconstituted wafer 200.

The warped wafer is ramped up to a first temperature through the heating element 612. The wafer 200 will then be heated to subsequent higher temperatures at a selected rate. After reaching a desired peak temperature, the wafer is slowly stair stepped down through a series of steps to slowly cool the wafer back to room temperature. This gradual cooling greatly reduces the stress in the wafer and removes the warpage from the wafer.

In one example, the first temperature zone heats the wafer to approximately 50° C. A subsequent temperature heats the wafer to 125° C. and the final high temperature might be in the range of 175-200° C. After the wafer is held at a brief period of time at the peak temperature, it is slowly cooled down through successive steps toward room temperature. For example, if the peak is 175° C. then it will be cooled slowly to 150° C. then, after a brief pause, cooled to 100° C., then after a brief pause cooled to 50° C., and then after a brief pause returned to room temperature. The warpage of the wafer is greatly reduced when the wafer is slowly cooled down toward room temperature. The slow cooling causes the internal stresses of the molding compound to be greatly reduced.

There may be various mechanisms at work that permit heating and slow cooling to reduce the warpage. A first mechanism may be that the reconstituted wafer becomes more uniformly homogenous throughout in the material in the heating and cooling cycle. Another mechanism might be that as the encapsulation material 101 reaches a high temperature, discontinuities and other stress causing zones smooth out to provide a more uniform encapsulation material. Any vapors, moisture, gases and other fluids are removed and the reconstituted wafer is made of a more homogenous material throughout. The slow cooling is particular beneficial to ensure that the reconstituted wafer 200 has a uniform density throughout and that the material can settle by slight movement rather than being immediately transitioned from a somewhat pliant state at the high temperature to being suddenly ridged. The stress of the reconstituted wafer 200 is greatly reduced by slowly cooling down from the high temperature $T_h$ to room temperature.

FIG. 6C shows another embodiment in which the wafers may be subjected to the proper heat and cooling cycles. As shown in FIG. 6C, the vacuum chuck 406 may be on a moving conveyor belt 618 or, the chuck 406 as a whole, is in the form of a moving conveyor belt. There are individual stations 620, 622, 624, 626, 628, 630 through which the wafer moves as it travels along the conveyor belt 618. At each of the different stations, different temperature zones are established by heating elements which are positioned within the zones. For ease of illustration, a single wafer 200 shown in solid lines is described as it passes along the conveyor belt 618 through the various zones. In a first step at 620, the wafer 200 will enter zone 1 and be gradually heated up toward the target temperature. Zone 1, for example, may heat the wafer to 50° C. as it passes slowly through zone 1. As the conveyor belt continues to move forward, it enters zone 2 at 622 which is heated to a higher range, for example, 100-125° C. As the wafer travels slowly through zone 2, it is heated up to stabilize at the temperature within zone 2. The wafer 200 will then enter zone 3, where it is shown as being present in 6C. Zone 3 may be held in the temperature range 175-225° C. As the wafer travels through zone 3 it will gradually increase in temperature to reach the same temperature as zone 3, shown in station 624. The wafer will then travel out of zone 3 into zone 4, 626, where it is slowly cooled. Zone 4 may be held at a slightly cooler temperature, for example, 150° C., and zone 5 of station 628 may be held at a somewhat cooler temperature, for example, 100° C., and the final zone, zone 6 at station 630 may be at a temperature closer to room temperature, for example 75-50° C.

The rate of travel of the conveyor 618 is selected based on the time that each wafer should spend within a particular zone in order to remove the warpage. Each encapsulation layer 101 material will have a different time temperature curve that it should be subjected to in order to remove the warpage. For some polymers, the target temperature in the highest zone may be in the range of 175-180° C., while for other polymers, the preferred target temperature may be in the range of 250-275° C. The target temperature reached is that temperature in which the encapsulation material becomes somewhat softer and stresses which have been induced into the encapsulation material because of the presence of the die can slowly be released and the wafer gradually urged into a flat position. The preferred temperature will be slightly different depending on each encapsulation layer 101 material and can easily be determined with a few test runs for each different encapsulation material. The rate of movement of the conveyor belt 618 will be selected to ensure that the wafer reaches a uniform temperature while in each zone and remains at that temperature sufficiently long that discontinuities, fluids, vapors and various sources of stress are removed from the reconstituted wafer 200. In one embodiment, the wafer will spend approximately 10-12 minutes at each station so that if there are stations the entire process for removing the warpage from the wafer may take in the range of one hour. For other types of encapsulation material, either shorter, for example, 20-30 minutes total time may be sufficient while for other types of material a much longer time may be needed, for example one hour per station, to fully remove the stress which has been created in the reconstituted wafer, for example, a total in the range of five to seven hours may be needed in some cases.

After the wafer 200 is cooled to room temperature, it is unclamped. Because the wafer 200 was gradually heated and cooled in the wafer heating line 600, wafer warpage and deformity are substantially reduced and they are substantially flat wafers. Once the wafer has substantially cooled, it may be cut for further processing into semiconductor packages, such as semiconductor package 100.

It should be appreciated that although heating the wafers has been described in 50-75° C. increments, any increment that gradually increases and decreases the temperature of the heating zone is contemplated in the present disclosure. Additionally, although there are six heating zones shown in FIG. 6C, there may be more or less heating zones depending on the heating and cooling needs of the wafer. Furthermore, the temperature to which the clamped wafer is heated may not necessarily be the temperature of the respective heating zone. For example, if a wafer 200 is to be heated to 175° C. for 30 minutes, keeping the wafer in a 300° C. heating zone for 10 minutes may accomplish this goal, but heating the wafer 200 to 300° C. may permanently damage the die.

Care should be taken to not heat the wafers 200 to a point where the die 102 begin to reflow, slightly melt, crystallize, cause movement of dopants or in some other way impact the integrated circuit and it is no longer capable of performing intended functions at the expense of forming a substantially flat reconstituted wafer 200. Accordingly, the highest temperature is selected to ensure that there is no impact on any of the circuits or structures in the individual die 102. Generally, if the die is kept at or below temperatures of 300° C. for periods of time of 10 minutes or less, this will not cause any change in the operating characteristics of the circuits in each individual die 102. At temperatures of 400° C. and higher, there is some risk that some of the dopants may begin to diffuse slightly away from their intended locations and that other materials which constitute the wafer, such as some of the metal lines, the alloys and the polysilicon, may migrate in undesirable patterns and thus impact the performance of the circuits in the die 102. Accordingly, care is taken to ensure that the time temperature profile which the reconstituted wafer 200 experiences is well below the range which would impact circuit performance of any of the die 102. The wafer 200 will therefore usually be kept below 400° C. at all times. Preferably, the highest temperature to which the reconstituted wafer is subjected is in the range of 225° C., and in one embodiment, is at 175° C. and does not exceed 180° C.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
positioning a first surface of a reconstituted wafer on a chuck, the reconstituted wafer having a plurality of semiconductor die embedded in an encapsulation material;
securing the reconstituted wafer on the chuck, the securing including:
reducing air pressure underneath the reconstituted wafer to bring the first surface of the wafer towards the chuck; and
applying mechanical pressure to an exterior edge of a second surface of the reconstituted wafer with a clamping bar;
heating the reconstituted wafer in stages;
cooling the reconstituted wafer in stages;
maintaining a vacuum seal by maintaining contact between the clamping bar and the second surface of the reconstituted wafer during the heating and cooling and maintaining the reduction of air pressure on the first surface of the wafer; and
reducing a curvature of the reconstituted wafer by the heating and cooling.

2. The method of claim 1 wherein applying mechanical pressure includes adjusting a distance between the clamping bar and the chuck during the heating and cooling.

3. The method of claim 1, wherein heating the reconstituted wafer includes heating the reconstituted wafer to a first temperature, and cooling the reconstituted wafer includes cooling the reconstituted wafer to a second temperature.

4. The method of claim 3, further comprising:
heating the reconstituted wafer to a third temperature that is greater than the first temperature; and
cooling the reconstituted wafer to a fourth temperature that is lower than the second temperature.

5. The method of claim 1 wherein the reducing the curvature includes applying a pressure with the clamping bar during the heating and cooling.

6. The method of claim 5 wherein the applying the pressure includes applying a first pressure during the heating and a second pressure during the cooling.

7. A reconstituted wafer system comprising:
a plurality of heating zones arranged adjacent to each other to sequentially heat a plurality of reconstituted wafers, the plurality of heating zones including:
a first temperature heating zone configured to heat a first one of the reconstituted wafers;
a second temperature heating zone configured to heat a second one of the reconstituted wafers as the first temperature heating zone heats the first one of the reconstituted wafers; and
a third temperature heating zone configured to heat a third one of the reconstituted wafers as the first and second temperature heating zones heat the first and second ones of the reconstituted wafers, respectively, the first and third temperature heating zones being lower in temperature than the second temperature heating zone, each of the reconstituted wafers having a plurality of die embedded in an encapsulation material;
a plurality of reconstituted wafer chucks configured to hold the reconstituted wafers in the plurality of heating zones and configured to move the reconstituted wafers from one of the heating zones to a next one of the heating zones, the chucks each including a clamping bar configured to apply mechanical pressure to an exterior edge the reconstituted wafer while the wafers are in the heating zones and to maintain a vacuum seal during the heating; and a plurality of vacuum lines configured to reduce air pressure underneath the reconstituted wafers in the chucks and configured to maintain the vacuum seal during the heating, the vacuum line being configure to maintain each wafer under vacuum conditions as the reconstituted wafers move from one heating zone to the next heating zone.

8. The reconstituted wafer system of claim 7, wherein the clamping bar is configured to form a seal around an edge of the reconstituted wafer.

9. The reconstituted wafer system of claim 8, wherein the clamping bar includes a clamp support coupled to the reconstituted wafer chuck and extending out from a surface of the reconstituted wafer chuck.

10. The reconstituted wafer system of claim 7, wherein each reconstituted wafer chuck has a recessed portion configured to hold the reconstituted wafer and reduce lateral movement with respect to a surface of the reconstituted wafer chuck.

11. The reconstituted wafer system of claim 7, wherein each vacuum line includes a plurality of vacuum openings.

12. The reconstituted wafer system of claim 7, further comprising a plurality of heating elements positioned within the plurality of heating zones.

13. A method comprising:
heating a reconstituted wafer in a first heating zone, the reconstituted wafer including a plurality of die embedded in an encapsulation material, the wafer having a first surface and a second surface;

applying mechanical pressure to an exterior edge of the second surface of the reconstituted wafer with a clamping bar;

moving the reconstituted wafer to a second heating zone;

heating the reconstituted wafer in the second heating zone, the first heating zone being lower in temperature than the second heating zone;

moving the reconstituted wafer to a first cooling zone;

cooling the reconstituted wafer in the first cooling zone, the second heating zone being greater in temperature than the first cooling zone;

reducing a curvature of the reconstituted wafer by the heating and cooling;

moving the reconstituted wafer to a second cooling zone;

cooling the reconstituted wafer in a second cooling zone, the first cooling zone being greater in temperature than the second cooling zone; and maintaining a vacuum seal by maintaining contact between the clamping bar and the second surface of the reconstituted wafer during the heating and cooling and maintaining a reduction of air pressure on the first surface of the wafer.

14. The method of claim 13, wherein the reconstituted wafer has an encapsulation material with semiconductors embedded and distributed therein.

15. The method of claim 13, further comprising:
reducing air pressure underneath the reconstituted wafer in the first heating zone, the second heating zone, the first cooling zone, and the second cooling zone.

* * * * *